(12) United States Patent
Paschalidis

(10) Patent No.: US 7,012,248 B2
(45) Date of Patent: Mar. 14, 2006

(54) TIME OF FLIGHT SYSTEM ON A CHIP

(75) Inventor: Nicholas P. Paschalidis, Silver Spring, MD (US)

(73) Assignee: The Johns Hopkins University, Baltimore, MD (US)

(*) Notice: Subject to any disclaimer, the term of this patent is extended or adjusted under 35 U.S.C. 154(b) by 0 days.

(21) Appl. No.: 10/511,069

(22) PCT Filed: Apr. 10, 2003

(86) PCT No.: PCT/US03/11205

§ 371 (c)(1),
(2), (4) Date: May 24, 2005

(87) PCT Pub. No.: WO03/088485

PCT Pub. Date: Oct. 23, 2003

(65) Prior Publication Data

US 2005/0211893 A1   Sep. 29, 2005

Related U.S. Application Data

(60) Provisional application No. 60/371,506, filed on Apr. 10, 2002.

(51) Int. Cl.
*H01J 49/40* (2006.01)

(52) U.S. Cl. .............. 250/287; 250/282; 250/281; 250/294; 250/296; 250/298; 250/299; 250/306; 250/307; 250/309

(58) Field of Classification Search ............ None
See application file for complete search history.

(56) References Cited

U.S. PATENT DOCUMENTS

2005/0061968 A1 * 3/2005 Green .................. 250/288

* cited by examiner

*Primary Examiner*—Nikita Wells
*Assistant Examiner*—Zia R. Hashmi
(74) *Attorney, Agent, or Firm*—Benjamin Y. Roca

(57) ABSTRACT

A CMOS time-of-flight "TOF" system-on-a-chip "SoC" for precise time interval measurement with low power consumption and high counting rate has been developed. The analog and digital TOF chip may include two Constant Fraction Discriminators "CFDs" and a Time-to-Digital Converter "TDC". The CFDs can interface to start and stop anodes through two preamplifiers and perform signal processing for time walk compensation (110). The TDC digitizes the time difference with reference to an off-chip precise external clock (114). One TOF output is an 11-bit digital word and a valid event trigger output indicating a valid event on the 11-bit output bus (116).

11 Claims, 5 Drawing Sheets

TIME OF FLIGHT SYSTEM ON A CHIP

CROSS REFERENCE TO RELATED APPLICATIONS

This application is related to and claims the benefit of U.S. Provisional Patent Application Ser. No. 60/371,506, filed Apr. 10, 2002 entitled "The Time of Flight System on a Chip (TOF chip)".

STATEMENT OF GOVERNMENTAL INTEREST

This invention was made with U.S. Government support under contract nos. NAGW-4547 and NAGW5-8516 with NASA. The U.S. Government has certain rights in the invention.

BACKGROUND

There is a broad family of science instruments that benefit from precise time interval measurement. These instruments include particle spectrometers, delay line UV imagers, laser range finding instruments, etc. In addition, for applications in space, size, weight, and reduced power dissipation are very desirable characteristics for these instruments. A key part of these systems is their electronics. An attractive solution with respect to the electronics is a very large scale integration (VLSI) System on a Chip (SoC) implementation. Such an implementation can dramatically reduce power dissipation, instrument size, and instrument weight significantly increasing the effectiveness of precise time measurement instruments.

SUMMARY

The present invention may be characterized as an integrated analog and digital time-of-flight (TOF) chip. TOF refers to the ability to capture and digitize precise time intervals. A time interval may be defined as the time between a start and stop electrical signal. The start and stop signals can be either analog or digital. The measurement of the unknown time interval is performed with reference to a known constant time interval equal to the period of an external clock. Thus, the three basic inputs to the TOF chip are the start signal, stop signal, and external clock signal. The result of the measurement is an 11 bit digital word output and a valid event trigger output that indicates a valid result on the 11 bit output bus. There are other inputs and outputs on the TOF chip including a separate standard microprocessor parallel readout bus, a serial bus, as well as control and test pins.

The TOF chip is comprised of two major functional blocks and a variety of lesser functional blocks. The first major functional block includes two constant fraction discriminators (CFDs) for measuring analog start and stop signals. The second major functional block includes a time-to-digital converter (TDC). Other blocks include a phase locked loop (PLL) that provides a control function for the TDC to lock to the external clock. The function of the PLL is very important because it performs power supply, temperature and radiation compensation tasks. Valid event digital control logic is a function that rejects anomalous event situations such as double starts, double stops, and the like. Another function includes three event accumulators for counting the total number of starts, stops, and valid events. There is a logarithmic compression function for the output and an averaging function for reducing single shot time jitter.

The complete CFD-TDC functionality is used when the start and stop signals are analog. TDC only functionality is used when the start and stop signals are digital. The TDC includes a core of 2048 very large scale integration (VLSI) elements. An electric pulse of duration equal to a start-stop time difference T is transmitted through the VLSI core. Core elements truncate the pulse by a certain fixed time (delta T) equal to a digitization step of the TDC commonly known as the least significant bit (LSB). As the pulse propagates through the VLSI core, its duration ultimately diminishes to zero and it disappears. The decoding of the position (N) within the core when this takes place is translated into a measure of the pulse length T where T=N*LSB. The LSB is easily defined by the external clock via the PLL and is in the range of −25 ps to 2.5 ns. The maximum time interval measured directly by the TDC is $T_{max}$=2048*LSB. Longer time intervals are measured by counting clock periods. The combination of fine measurement via the 2048 VLSI core elements and coarse measurement via clock periods provides a very large time interval measurement equal to 32 bits or, $2^{32}$*LSB, that has a resolution as fine as LSB. Thus, $T_{max}$ is approximately 0.1 seconds for an LSB of 25 ps and approximately 10 seconds for an LSB of 2.5 ns.

The TOF chip of the present invention includes all of the analog and digital signal processing necessary for time interval acquisition and digitization in a single monolithic chip. It is a plug-and-play analog (and/or digital) input digital output device that uses very little power and provides tremendous resolution.

DETAILED DESCRIPTION

Figure 1:
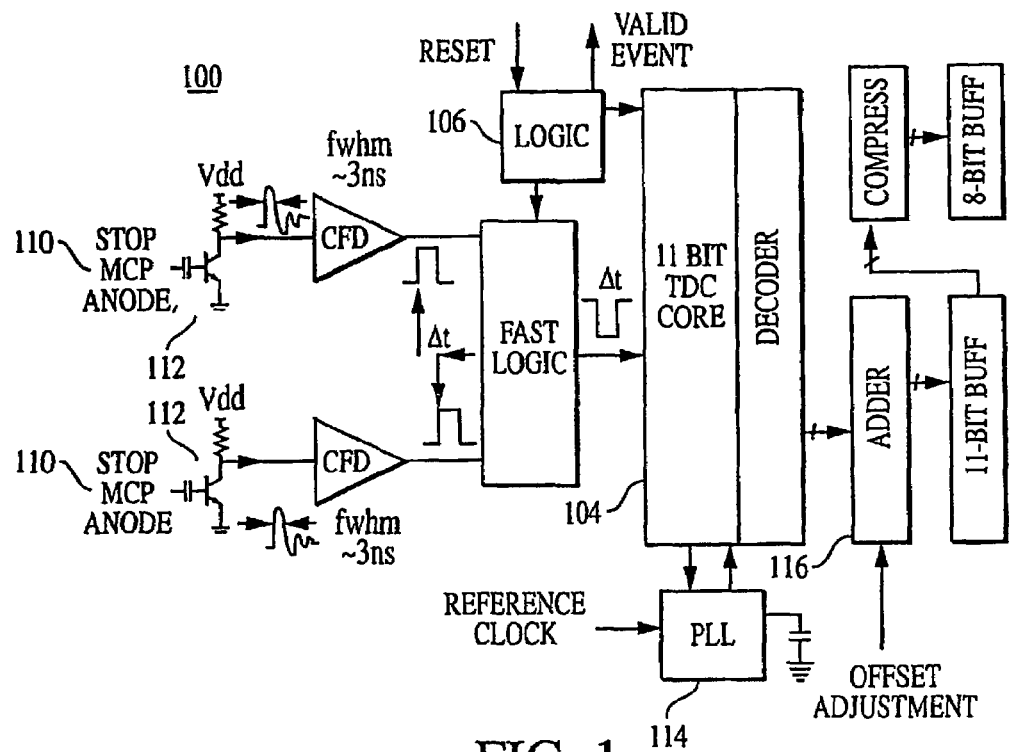
FIG. 1 illustrates a block diagram of the time-of-flight (TOF) chip.

A high level block diagram of a time of flight (TOF) chip according to the present invention is illustrated in FIG. 1. The TOF chip includes two constant fraction discriminator (CFD) channels 102, one time-to-digital conversion (TDC) core 104, valid event logic circuitry 106, and event accumulators. The CFDs 102 interface to start-stop MCP anodes 110 via off-chip single transistor amplifiers 112. The TDC core 104 digitizes the start-stop time difference using 11-bits, with reference to an off-chip precise clock. An integrated phase locked loop 114 (PLL) provides a time reference to the external clock and compensates for power supply, temperature, and other environmental variations.

The valid event logic 106 rejects invalid events such as double starts, stops not associated with a start in a predefined window, single event upset (SEU) caused errors, and others. An adder/subtractor 116 optionally corrects for offsets. Four counters measure the total number of start, stop, valid event pulses and total number of events (valid or not) that are processed. For each valid event, a TOF result is provided directly onto a bus after a certain processing deadtime. The TOF result is an 11-bit linear word or an 8-bit quasi-log compressed word.

Figure 2:
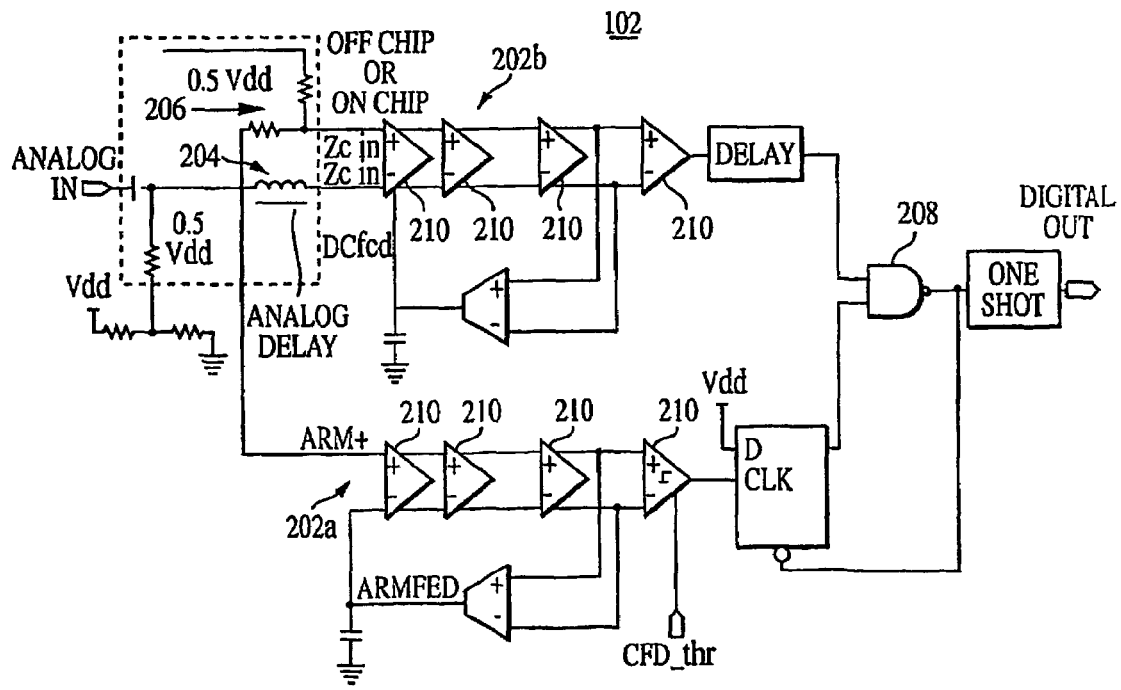
FIG. 2 illustrates a block diagram of a constant fraction discriminator (CFD).

A block diagram of a CFD 102 channel is illustrated in FIG. 2. Each CFD 102 utilizes two comparators 202a, 202b, an analog delay line 204, and a voltage divider 206 to form the constant fraction operation. The bottom comparator 202a is termed the arming comparator or leading edge discriminator and it fires when an input pulse crosses a threshold value. The top comparator 202b is termed the zero crossing comparator and it fires when the difference of its two inputs switches polarity. The delay line 204 is external to the chip. There is also an optional on-chip analog delay line with controllable delay in the range of 0.5 ns to 2 ns. Typical delay values are in the range 1 ns to 2 ns for input pulses with peaking times 3 ns to 6 ns. The comparator baseline is internally adjusted to 0.5 $v_{dd}$. The comparators 202a, 202b are self-compensated to remove offsets with the help of feedback loops. The gain of the loops is quite large so that the offsets are compensated to less than 0.2 mv. The bandwidth of the two feedback circuits, which is also controllable off-chip, is selected low compared to the bandwidth of the forward chain for overall stability.

A positive input pulse is applied to the arming comparator input Arm+. A delayed version of the pulse is applied to zero crossing comparator input Zcin−, while an attenuated version is applied to input Zcin+. The arming comparator 202a fires and sets the flip-flop when the input amplitude crosses a user-defined threshold. The zero crossing comparator 202b fires at a constant fraction of the input pulse at a time theoretically independent of the amplitude. An AND combination 208 of the two comparators 202a, 202b produces a CFD output that, in terms of timing properties such as time walk and time jitter, is defined by the zero crossing comparator 202b. Both the arming and CFD outputs are available with both polarities.

For precise time pick-off, it may be necessary to operate at as high a speed as possible so a cascade comparator topology is used. It is possible to optimize the gain-bandwidth product by selecting the number of stages and the gain-bandwidth of the individual stages such that the overall low frequency gain is equal to:

$$A_V = Av_1 \cdot Av_2 \cdot \ldots \cdot Av_i \cdot \ldots \cdot Av_n \quad (1)$$

where $Av_i$ is the gain of the $i^{th}$ stage. Each stage is comprised of an operational trans-conductance amplifier (OTA) 210. The transfer function of an OTA 210 is described by an integrator with a single dominant pole. Assuming equal bandwidth for all stages the frequency dependence of the total gain can be expressed as:

$$A_V(j\omega) \cong (Av_i)^n \left(\frac{1}{j\omega\tau + 1}\right)^n$$

where $$\frac{1}{\tau} \approx gm/Co$$

and $$Av_i \approx gm/go$$

in which gm, go, and Co are the trans-conductance, the output conductance, and the parasitic output capacitance for each OTA 210. Solving for $\omega_{-3dB}$ yields:

$$\omega_{-3\,dB} = \frac{1}{\tau}\sqrt{2^{\frac{1}{n}} - 1} \quad (2)$$

Although the gain increases with the number of stages, overall bandwidth decreases. Therefore, an optimum number of stages can be selected to maximize the bandwidth for a given total gain. In this example, the gain of each stage is selected at approximately 3.5 the nominal CFD current of approximately 1.8 mA and the single stage pole is gm/Co≈2×10⁹ rad/sec.

With n=8 for the zero crossing comparator 202b the overall gain is 87 dB and the negative 3 dB bandwidth is 30% of the single stage. With n=5 for the arming comparator 202a the overall gain is 54 dB and the negative 3 dB bandwidth is 38% of the single stage.

The TDC design is generic to cover a broad range of scientific applications utilizing different modes of operation. Some general requirements of the TDC 104 include: a capability to process both random and triggered events; a low dead time to process event rates up to 1 M/s; stability for temperature, power supply, and environmental effects such as radiation (TVE); built-in logic to rapidly reject non-valid events such as double starts, stops with no starts, etc; good integral non-linearity; and low power dissipation.

Figure 3:
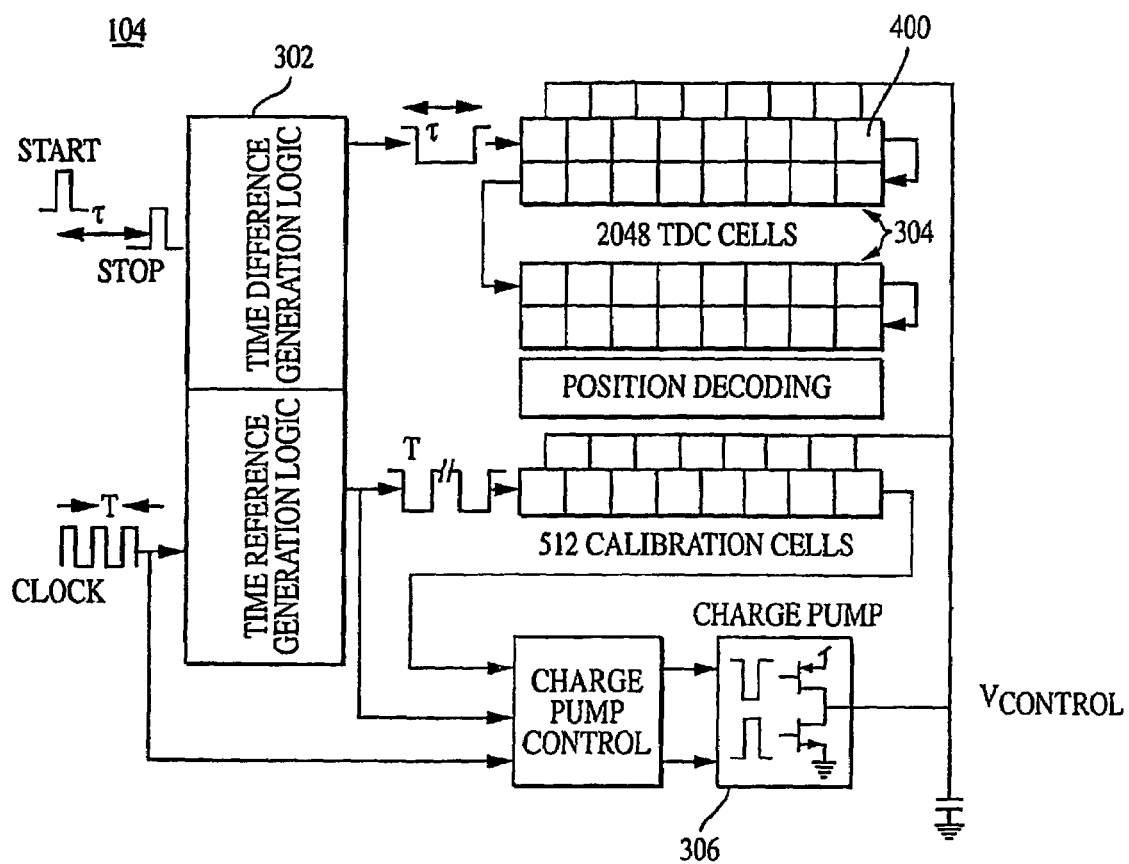
FIG. 3 illustrates a block diagram of a time-to-digital converter (TDC).
Figure 4:
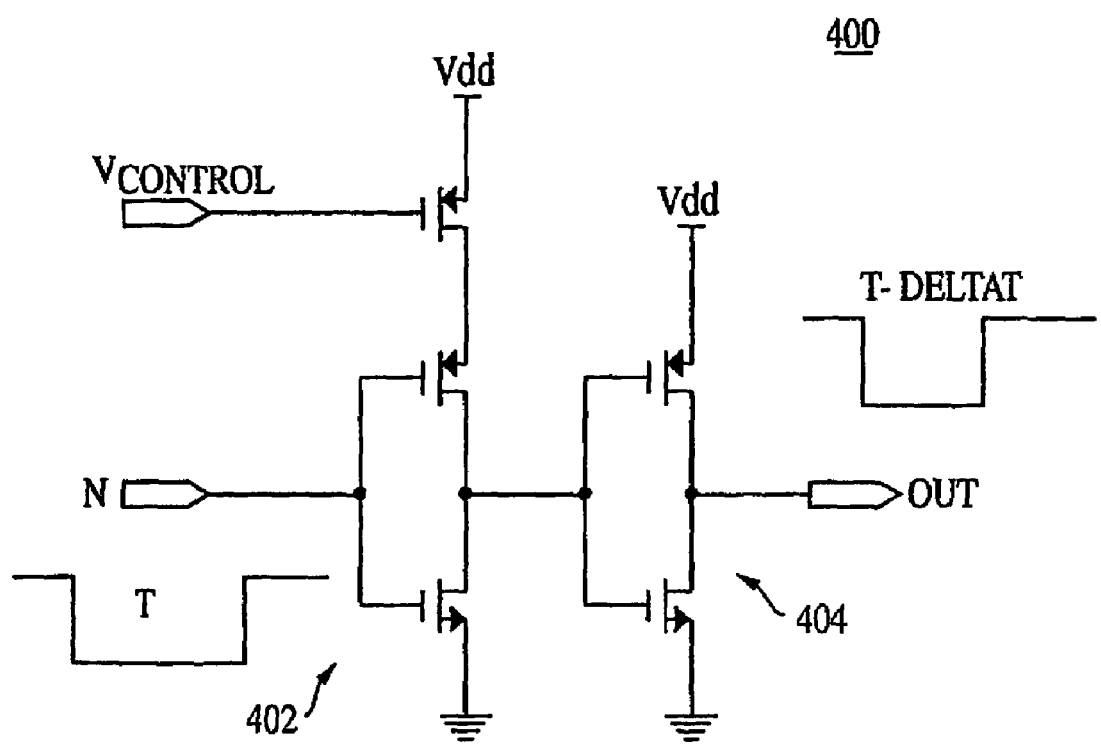
FIG. 4 illustrates a transistor level diagram of a DLL cell.

The principle of operation of the TDC chip is described in FIGS. 3 and 4. Referring to FIG. 3, the start-stop time difference is defined by the rising edges of two positive going signals entering a time difference generating logic (TDGL) block 302. The TDGL logic 302 additionally filters many non-valid events. A valid negative going pulse with duration equal to the start-stop time difference then enters a core of 2048 TDC cells 304. Each cell truncates the traveling pulse by a certain fixed time amount Δt, equal to the least significant bit (LSB) of the TDC system. If the start-stop time difference is less than $T_{max}$=2048×LSB, the traveling pulse will disappear at a certain cell location inside the core. Decoding of that cell location yields a digital reading of the event. Decoding is achieved via RS flip-flops contained in every cell. If the flip-flop of one cell is set and the flip-flop of the next cell is not, the position is decoded using a thermometer logic circuit. If start-stop is greater than $T_{max}$, the system simply overflows and clears automatically to accept another event.

The basic element of the core, a TDC cell, is illustrated in FIG. 4. The TDC cell 400 is comprised of a current starving inverter 402 followed by a standard inverter 404. The $V_{control}$ voltage generated by a charge pump circuit 306, controls the rise time of a pulse $t_{r1}$, at the output of the current starving inverter 402.

The falling time $t_{f1}$ is defined by a pull down transistor. Thus, the output of the first stage is asymmetrical and electronically controlled. The second stage is a standard inverter 404 with properly sized pull-down and pull-up for symmetrical operation. The cumulative effect of the TDC cell to a negative pulse with duration T is a negative output pulse with reduced duration. The reduced duration is controllable and is expressed as delta−T.

The delay introduced to a falling edge traveling through a TDC cell is:

$$t_f = t_{r1} + t_{f2}$$

The delay introduced to a rising edge is:

$$t_r = t_{f1} + t_{r2}$$

It is possible to design the cell so that approximately:

$$t_{f1} \cong t_{f2} \cong t_{r2}$$

Thus, the total width of the pulse after a TDC cell is reduced by:

$$\Delta t = t_f - t_r \cong t_{r1} - t_{r2}$$

We define the time truncation as:

$$\text{delta-}T = \Delta t$$

which is the LSB of the TDC system where:

$$LSB \cong t_{r1} - t_{r2} \qquad (3)$$

The processing time required to digitize a start-stop time difference T that results in a code N is:

$$T_N = N t_r + T$$

where $t_r$ has been defined as the delay introduced by a single cell to a traveling rising edge. We define the dead time (Tdt) of the TDC as the time it takes to digitize the maximum time ($T_{max}$) that results in the maximum code.

$$T_{N_{max}} = N_{max} t_r + T_{max} \qquad (4)$$

The TDC chip is designed to operate in full-core (11-bits) where all 2048 cells are used, half-core (10-bits) where only 1024 cells are used, and quarter-core (9-bits) where only 512 cells are used. In each case, the LSB is the same and is defined by the clock. However, the maximum measurable time and the dead time scale accordingly.

Thus:

$$T_{max\ 2048} = 2048 \cdot LSB$$

$$T_{max\ 1024} = T_{max\ 2048}/2$$

$$T_{max\ 512} = T_{max\ 2048}/4$$

$$Tdt_{2048} = 2048 \cdot t_r + T_{max\ 2048}$$

$$Tdt_{1024} = Tdt_{2048}/2,$$

$$Tdt_{512} = Tdt_{2048}/4.$$

The smaller the dead time, the higher the event rate could be processed.

The LSB as expressed in equation (3) above is a strong function of temperature, power supply and radiation induced MOS parameter shifts, unless a special control operation is applied to keep it stable. Stability is achieved by implementing a special PLL known as a delay locked loop (DLL). Parts of the DLL include a time reference generating logic (TRGL) block 308 and the charge pump 306. The TRGL 308 applies a train of negative going pulses with pulse width $T_{clk}$ equal to the period of the clock. The charge pump 306 adjusts the $V_{control}$ error voltage, so that these pulses disappear on average at the end of the DLL delay line. The error voltage, $V_{control}$ is low pass filtered and applied to all 2048 elements of the main TDC core.

The TDC is designed to have two calibration modes of DLL. The first is an open loop DLL, with 2048-elements to make the event measurements and a separate closed loop DLL having 512 elements locked to a reference clock for the calibration. The second calibration mode is a closed loop DLL, having 2048 elements for both event measurements and the calibration. Open loop calibration mode is mostly used in random event cases such as space particles and UV. Closed loop calibration mode is used in triggered event cases such as laser range finding. Closed loop calibration mode can also be used for random events when it is acceptable to lose a certain number of events during calibration (typically 1% due to slow calibration).

In open loop calibration mode, a pulse of width equal to the period of the reference clock is applied every 2048 (or 128) clock periods into the 512 element calibration DLL. The sum of the 512 element delay is forced to be equal to the clock period, $T_{clk}$. The controlled voltage generated by the charge pump is applied to both the 512-element calibration DLL and the 2048-element open loop DLL as illustrated in FIG. 3. The LSB in open loop calibration mode becomes:

$$LSB_{mode-a} \cong \frac{Tclk}{512} \qquad (5)$$

and the maximum measurable time becomes:

$$T\max_{mod\ e-a} = T_{2048} \cong 4 \cdot Tclk.$$

In closed loop calibration mode, a pulse of width equal to the period of the reference clock is applied into the same 2048 element DLL in a time sharing mode with the event measurement. Time sharing is defined by a user supplied calibration trigger. Typically a trigger frequency of 1 KHz is enough to compensate for environmental (TVE) effects. While calibrating, the system rejects incoming start-stop events, implying a loss of a small number of events when operating in random mode. The sum of the 2048 element delay is forced to be equal to the clock period, $T_{clk}$. The control voltage generated by the charge pump is then applied to the entire 2048 element closed loop DLL. The LSB in closed loop calibration mode becomes:

$$LSB_{mode-b} \cong \frac{Tclk}{2048} \qquad (6)$$

and the maximum measurable time becomes:

$$T\max_{mod\ e-b} = T_{2048} = Tclk.$$

In the 0.8 u CMOS technology used to fabricate some TOF chips, the cumulative delay of a two-inverter element is approximately 0.6 ns. In a typical case of a 10 MHz-reference clock the following results are expected for open calibration mode, an $LSB_{mod\ e-a} \approx 200$ ps where the maximum measurable times and dead times are approximately 400 ns measurable time and approximately 1200 ns+400 ns dead time for full core, approximately 200 ns measurable time and approximately 600 ns+200 ns d time for the half core, and approximately 100 ns measurable time and approximately 300 ns+100 ns d time for the quarter core.

For closed loop calibration mode and a 10 MHz reference clock, the $LSB_{mod\ e-b} \approx 50$ ps where the maximum measurable time is approximately 100 ns and dead time is approximately 1200 ns+100 ns.

Another aspect of the DLL is matching between cells in the core and the resulting integral non-linearity (INL) error. However, if INL distribution is fixed and does not vary with TVE, it can be easily removed by post-calibration.

An analysis was performed to derive general matching properties and design principles. Mismatches among the TDC cells will result in time errors. Process parameters such as transistor trans-conductance parameter, $\beta = Ko*W/L$ threshold voltage, $V_t$, and gate or diffusion capacitances, C, are not identical inside the whole chip area. Time truncation, or the LSB as defined in equation (3) of the single TDC cell of FIG. 4, can be expressed as:

$$LSB \cong \left(\frac{C_i}{\beta_p(Vgs - Vt)^2}\right) \times V_{IHi} - \left(\frac{C_o}{\beta_p(Vdd - Vt)^2}\right) \times V_{IHe} \qquad (7)$$

where $C_i$ is the overall internal node capacitance, $C_o$ is the overall output capacitance, $\beta_p$ is the transconductance parameter of the pFETs, $V_t$ is the threshold voltage of the PFETs, $V_{gs}=V_{control}$ is the gate source voltage that controls the delay of the current starved pFET, $V_{dd}$ is the power supply; $V_{IHi}$ is the gate-source voltage at which the internal nFET pulls-down, and $V_{IHe}$ is the gate-source voltage at which the external nFET pulls-down. Both $V_{IHi}$ and $V_{IHe}$ are proportional to the threshold voltage $V_{tn}$ of the nFETs. The parenthetic terms of equation (7) approximate the inverse of the rise-time slew rates of the starved and the internal pFETs respectively.

Assuming independence between all parameters in above expression, the normalized variance $\delta_1^2 = \delta^2(\Delta LSB/LSB)$ of the LSB can be expressed as:

$$\sigma^2\left(\frac{\Delta LSB}{LSB}\right) = \qquad (8)$$

$$\sigma_{Ci}^2 + \sigma_{Co}^2 + 2\sigma_{\beta_p}^2 + 2\sigma_{Vt_n}^2 + 4\left[\frac{V_t^2}{(V_{gs}-V_t)^2} + \frac{V_t^2}{(V_{dd}-V_t)^2}\right]\sigma_{Vt}^2$$

where $\delta_X^2 = \delta^2(\Delta X/X)$. Each variance operator $\delta^2$ in the above expression is inversely proportional to the transistor gate area, $\delta^2$ approximately $1/WL$. In addition matching is improved with a large value of $V_{gs}-V_t$ for all operating conditions. It also helps to use the maximum power supply possible. For the present discussion, much larger than minimum device areas are described and the cell was optimized to operate in the 50 ps to 500 ps range with $V_{gs}$ close to $V_{dd}$ at the high end time resolution.

It is interesting to investigate how device matching propagates in the DLL chain. The variance of the open (non-controlled) delay line after m delay elements is simply the sum of the variances of m elements:

$$\sigma_m^2 = m\sigma_1^2 \qquad (9)$$

However, the variance of a closed delay line at the $N_{th}$ element will be different, because of the constraint that the sum of the individual delays $$\sum_{k=1}^{N} T_k$$

is forced to be constant. The variance at the m element of a DLL of N total elements is described by:

$$\sigma_m^2 = \sigma_1^2\left[\frac{m\cdot(N-m)}{N}\right] \qquad (10)$$

The maximum time variance occurs in the middle of the delay line at $m=N/2$ with a value:

$$\sigma_{N/2}^2 = \frac{N}{4}\sigma_1^2 \qquad (11)$$

Thus, the variance of the maximum time deviation of a closed DLL line is ¼ the value of the open loop delay line.

In open loop mode of operation, the measurement DLL is open and has 2048 elements. The variance at the end will be:

$$\sigma_{2048\_open}^2 = 2048\cdot\sigma_1^2.$$

In closed loop mode of operation, the DLL is closed and has 2048 elements. The variance at the end will be:

$$\sigma_{2048\_closed}^2 = 512\cdot\sigma_1^2$$

and the variance in open loop mode is 4-times worse of that in closed loop mode.

It is possible to fix the increased variance of open loop mode on a chip by chip basis if one measures the maximum processing time of a particular chip, $T\ max_{mod\ e-a} = T_{2048\_measured}$ in the full core selection. This measured value will generally have an offset because it is an open DLL where:

$$T_{2048\_measured} = 4\cdot T_{clk} + T_{offset} \qquad (12)$$

However, $T_{2048\_measured}$ has a fixed value independent of the TVE variation and a new LSB can be defined as:

$$LSB_{mode-a-measured} \cong \frac{T_{2048\_measured}}{2048} \qquad (13)$$

With this measured LSB value the open loop DLL behaves like a closed loop DLL in that the total delay is fixed. The INL will again have minimum values at the beginning and at the end of the DLL and the maximum variance around the expected value based on the measured LSB will be in the middle and still equal to:

$$N/4\sigma_1^2 = 512\cdot\sigma_1^2.$$

This is achieved because of the measurement of the offset error.

The last consideration pertaining to the TDC is timing jitter error. In all modes of operation timing jitter is a monotonically increasing function of the start-stop time difference because of the additive effect of each DLL element. Special care is taken to minimize jitter such as crosstalk from clock lines with many guard-rings in the layout etc. The time jitter contribution of the TDC is much less than the overall time error introduced by the front-end (CFD jitter plus time walk).

One common measurement in space is the detection of energetic particles. One application specific use for the TOF chip of the present invention is within a compact Energetic Particle Sensor (EPS) system. The TOF chip reduces EPS system mass to less than 0.5 Kg and power dissipation to less than 0.5 w. These are major improvements over the current state of the art.

Figure 5:
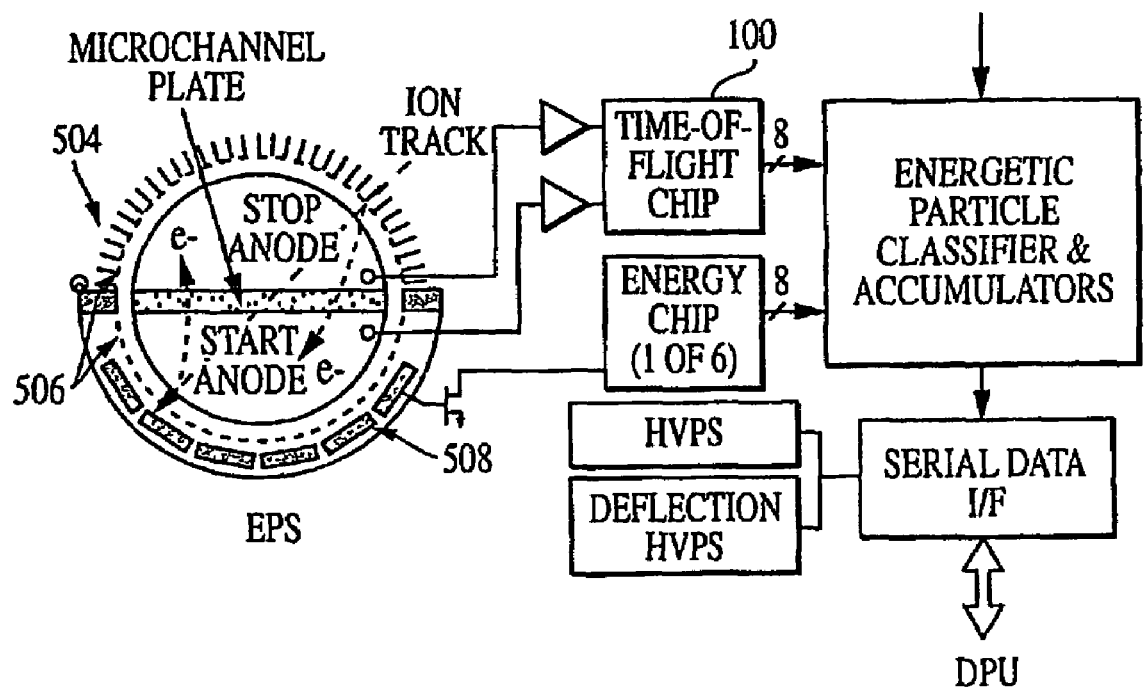
FIG. 5 illustrates a block diagram of an energetic particle sensor (EPS) system utilizing the TOF chip of the present invention.

A top-level schematic that describes the principle of operation of such an EPS is shown in FIG. 5. For each radiation event the instrument uses combined time-of-flight and energy measurements to discriminate ion species.

Energetic particles randomly enter a detector head 502, from an 180° opening through a collimator 504. Particles penetrate a thin foil 506 in the front and hit an assembly of (six in this case) Solid State Detectors (SSDs) 508 in the back. Secondary electrons produced in the front and back foils are electro-statically focused on corresponding start and stop MCP anodes.

Processing of the start-stop time difference yields the speed of a particle, and processing of the total charge released in an SSD yields particle energy. Particle mass is determined by combining the TOF and energy measurements. In addition, a particular SSD address provides angular information.

Figure 6:
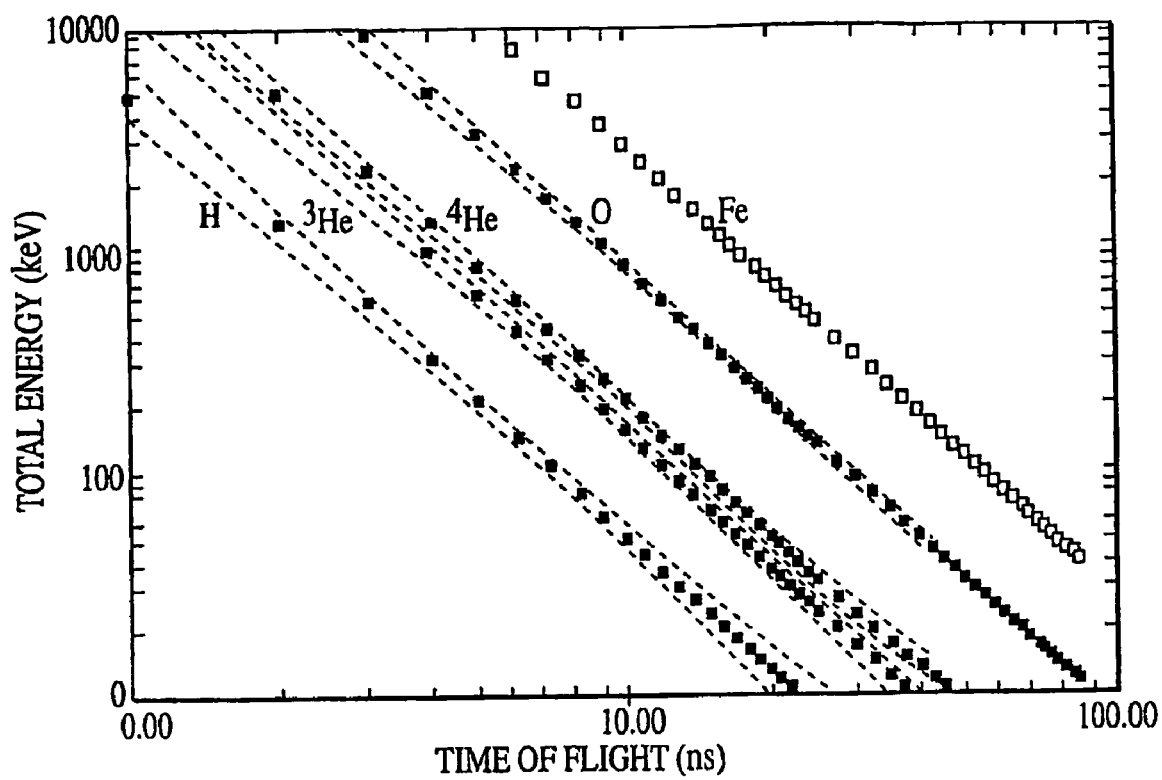
FIG. 6 illustrates the time of flight interval versus energy for four groups of ion mass categories.

The goal of the EPS is to discriminate ions in four common mass categories as measured in space (H, He, O, Fe) as well as eight energy bands (10 KeV/neucleon to 2 MeV/neucleon). FIG. 6 illustrates the time of flight interval versus energy for four groups of ion mass categories. In order to discriminate these four mass categories a time resolution of approximately 0.5 ns and an energy resolution of approximately 5 Kev FWHM are required depending on particular telescope geometries. A desirable event-processing rate is on the order of 0.1 to 0.2 M/s. Furthermore, it is highly desirable to improve the time and energy resolution in order to discriminate for isotopic mass species and push the lowest energy threshold to less than 1 Kev. To achieve these targets, the time and energy resolutions should be improved to less than 100 ps and less than 0.4 kev FWHM respectively. Additionally the event throughput are increased to greater than 1 M/s due to lower energy thresholds and the low power nature of the particle distributions.

In the following claims, any means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

The invention claimed is:

1. A time-of-flight (TOF) system integrated onto a single chip for measuring precise time intervals, said system comprising:
   a first constant fraction discriminator for receiving an analog start signal input and providing a digital output representative of the start signal;
   a second constant fraction discriminator for receiving an analog stop signal input and providing a digital output representative of the stop signal;
   a logic circuit coupled with the first and second constant fraction discriminators for determining a $\Delta t$ time interval between the start and stop signals; and
   a time-to-digital converter (TDC) receiving as input the $\Delta t$ time interval between the start and stop signals, said time-to-digital converter for digitizing the $\Delta t$ time interval with reference to an off-chip precise reference clock.

2. The system of claim 1 further comprising valid event logic coupled with the time-to-digital converter, the valid event logic for rejecting invalid events.

3. The system of claim 1 further comprising a phase locked loop coupled with the time-to-digital converter, the phase locked loop for providing a time reference to the off-chip reference clock and to compensate for temperature and power supply variations.

4. The system of claim 1 further comprising adder logic coupled with the time-to-digital converter, the adder logic for correcting for timing offset.

5. The system of claim 1 wherein the output of the time-of-flight chip is an 11-bit linear word.

6. The system of claim 1 wherein the output of the time-of-flight chip is an 8-bit compressed word.

7. The system of claim 1 wherein original digital start and stop signals can be directly input to the time-to-digital converter bypassing the constant fraction discriminators.

8. The system of claim 1 wherein each constant fraction discriminator comprises:
   an arming comparator having built-in hysterisis for avoiding multi-firing around a threshold), said arming comparator for receiving a positive input pulse wherein the arming comparator fires when the positive input pulse crosses a threshold;
   a zero crossing comparator for receiving a delayed version of the positive input pulse and an attenuated version of the positive input pulse wherein the zero crossing comparator fires at a constant fraction of the positive input pulse; and
   a logical AND gate coupled with a one-shot for receiving the output of the arming comparator and the zero crossing comparator, the AND gate and one-shot providing a digital output for the constant fraction discriminator.

9. The system of claim 8 wherein each constant fraction discriminator further comprises an on-chip analog delay line.

10. The system of claim 1 wherein the time-to-digital converter comprises:
    a time difference generating logic component for determining a start-stop time difference defined by the rising edges of two positive going signals;
    a time reference generating logic component for applying a train of negative going pulses from the reference clock to a calibration delay locked loop DLL;
    a core of time-to-digital converter cells for receiving a valid negative going pulse of duration equal to the start-stop time difference wherein each cell truncates the valid negative going pulse by a fixed time; and
    a position decoding component for determining the cell location where the valid negative going pulse disappeared.

11. The system of claim 10 wherein each time-to-digital converter cell is comprised of:
    a current starving inverter; and
    a standard inverter coupled with the current starving inverter,
    such that a negative pulse of duration T entering a time-to-digital converter cell yields a negative output pulse with a controllable reduced duration.

* * * * *